(12) United States Patent
Wang et al.

(10) Patent No.: US 7,906,411 B2
(45) Date of Patent: Mar. 15, 2011

(54) DEPOSITION TECHNIQUE FOR PRODUCING HIGH QUALITY COMPOUND SEMICONDUCTOR MATERIALS

(75) Inventors: Wang Nang Wang, Bath (GB); Sergey Igorevich Stepanov, St. Petersburg (RU)

(73) Assignee: Nanogan Limited, Bath (GB)

( * ) Notice: Subject to any disclaimer, the term of this patent is extended or adjusted under 35 U.S.C. 154(b) by 55 days.

(21) Appl. No.: 11/571,514

(22) PCT Filed: Jun. 27, 2005

(86) PCT No.: PCT/GB2005/002529
§ 371 (c)(1),
(2), (4) Date: Sep. 4, 2007

(87) PCT Pub. No.: WO2006/003381
PCT Pub. Date: Jan. 12, 2006

(65) Prior Publication Data
US 2008/0132040 A1    Jun. 5, 2008

(30) Foreign Application Priority Data

Jun. 30, 2004 (GB) .................................. 0414607.2

(51) Int. Cl.
*H01L 21/20* (2006.01)
*H01L 21/36* (2006.01)
*C23C 16/00* (2006.01)

(52) U.S. Cl. .............................. 438/478; 118/723 VE

(58) Field of Classification Search .................. 438/478; 118/715, 723 VE
See application file for complete search history.

(56) References Cited

U.S. PATENT DOCUMENTS 5,192,370 A * 3/1993 Oda et al. .................. 118/723 R
2004/0129213 A1  7/2004 Shreter et al.

* cited by examiner

*Primary Examiner* — W. David Coleman
(74) *Attorney, Agent, or Firm* — Christie, Parker & Hale, LLP

(57) ABSTRACT

Deposited layers are advantageously obtained by utilizing a specific hydride vapor phase epitaxy deposition procedure. In this procedure, a vertical growth cell structure with extended diffusion layer, a homogenising diaphragm, sidewall purging gases, anal independent gas and substrate heaters is used for the deposition of III-V and VI compound semiconductors. This gas flow is uniformly mixed through the extended diffusion layer and directed so that it contacts the full surface of the substrate to produce high quality and uniform films. Exemplary of such gas flow configurations are the positioning of a substrate at a distance from the gas outlets to allow the extended diffusion and a diaphragm placed in a short distance above the substrate to minimize the impact of the convection effect and to improve the uniformity. This symmetrical configuration allows easy scale up from a single wafer to multi-wafer system. This vertical configuration allows the quick switching between different reactive gas precursors so that time modulated growth and etch processes can be employed to further minimize the defects density of the deposited materials.

46 Claims, 11 Drawing Sheets

US 7,906,411 B2

DEPOSITION TECHNIQUE FOR PRODUCING HIGH QUALITY COMPOUND SEMICONDUCTOR MATERIALS

CROSS-REFERENCE TO RELATED APPLICATION(S)

The present application is the National Stage of International Application No. PCT/GB2005/002529, filed Jun. 29, 2005, which claims the benefit under 35 U.S.C. §119 of United Kingdom Application No. 0414607.2, filed Jun. 30, 2004, incorporated herein by reference in their entirety.

BACKGROUND OF THE INVENTION

1. Field of the Invention

The present invention relates to material deposition. More particularly, the invention relates to material hydride vapour phase epitaxy (HVPE) deposition using a vertical growth cell with extended diffusion and time modulated growth processes for growth of semiconductors of IV and III-V groups and their alloys.

2. Description of the Prior Art

Many processes have been developed for the deposition of materials, e.g. semiconductor materials, on a substrate. One such process involves the use of a precursor gas, i.e. a gas that upon contact with the substrate undergoes a modification such as a chemical reaction to yield a deposited layer. In these vapour deposition processes, generally, the gas flow and its spatial relationship to the substrate are carefully controlled. For example, in the most common spatial configuration employed in chemical vapour deposition (CVD) or hydride vapour phase epitaxy (HVPE), as shown in FIG. 1, a gas flow is established at one end of a horizontal vessel 1, a substrate 3 is placed within the vessel, and a gas flow is established in the direction of arrows 2, parallel to the major surface of the substrate 3. There are many disadvantages for such horizontal reactors. The main drawback is the difficulty to obtain simultaneously high efficiency of gas utilization and good uniformity of growth. Generally, the uniformity $\delta$ of a rotating substrate can be approximated by the equation:

$$\delta = \eta(1-2/\pi)/(1-\eta), \text{ where } \eta \text{ is the efficiency of gas utilization.}$$

This means that for a uniformity better than 3%, the deposition efficiency will be less than 10%. The symmetry and the related flow dynamics make the growth processes difficult to control, and also make the reactor difficult to scale up.

In all alternative configuration shown in FIG. 2 employed in vertical CVD or HVPE processes, the gas flow direction 2 is generally perpendicular to the major surface of the substrate 3. The first configuration, i.e. the horizontal configuration, is most commonly used because it introduces the least perturbation in the precursor gas flow. However, the latter configuration is at times employed when it is desired to minimize the temperature gradient across the substrate introduced by the corresponding axial temperature gradient in the reactor. Disadvantages of conventional vertical tube HVPE reactors include the difficulty of controlling the growth uniformity due to its simple cylindrical tube configuration, and the large amount of parasitic deposition on reactor walls resulting from the difficulties in obtaining controlled temperature difference between the reactor walls and the substrate.

Another vertical growth cell configuration with improved uniformity is a "shower head" vertical CVD process shown in FIG. 3 for forming a material layer on a surface of a substrate with a shower head 22 directing the gaseous flow to contact the substrate 3, which has a substrate heater 11. The configuration is characterized in that (1) the surface of the substrate 3 is spaced an average distance less than ¼ the substrate effective radius from the shower head directing surface, (2) such directing surface is defined to have an incompressible imaginary sphere with a diameter of ¹/₁₀ the substrate effective radius along all accessible surfaces of the shower head and (3) at least 50 percent of the gas flow that contacts the substrate undergoes contact initially at an interior point of the substrate surface before it cuts a plane that is tangent to the periphery of the substrate and normal to the surface of the substrate upon which deposition is desired.

The main disadvantages of this shower head configuration is the parasitic deposition on reactor head and walls resulting from the close proximity of the shower head and the substrate and the difficulties in obtaining temperature difference between the reactor walls and the substrate.

There may be mentioned as prior art: U.S. Pat. No. 6,176,925; U.S. Pat. No. 6,177,292; U.S. Pat. No. 6,179,913; U.S. Pat. No. 6,350,666; U.S. Pat. No. 5,980,632; U.S. Pat. No. 6,086,673; U.S. Pat. No. 4,574,093; and "Handbook of Crystal Growth", vol. 3, edited by D. T. J. Hurle, Elsevier Science 1994.

SUMMARY OF THE INVENTION

According to the present invention from one aspect there is provided a chemical vapour deposition process for forming a material layer on a surface of a substrate, comprising the use of a cylindrical vertical hydride vapour phase epitaxy (HVPE) growth reactor with all extended diffusion layer, a homogenizing diaphragm, independent side wall gas heater and substrate heater, a cylindrical side wall gas purging line and a cylindrical side wall gas exit slit.

According to the present invention from another aspect, there is provided chemical vapour deposition apparatus for foaming a material layer oil a surface of a substrate, comprising a cylindrical vertical hydride vapour phase epitaxy (HVPE) growth reactor with an extended diffusion layer, a homogenizing diaphragm, independent side wall gas heater and substrate heater, a cylindrical side wall gas purging line and a cylindrical side wall gas exit slit.

The material layer could comprise group III-V and VI materials.

The material layer deposited on the surface of the substrate could be provided by a time-modulated growth method, allowing switching between different reactive gases for a controlled growth mode (lateral or vertical) and in situ etching and annealing of deposited material.

The growth reactor could use an opposite direction flow geometry.

The diaphragm could have a diameter which is close to the effective diameter of the substrate.

The growth reactor could have a mixing chamber and a mixing plate to enhance deposition uniformity.

The extended diffusion layer could have a length larger than the effective diameter of the substrate.

The growth reactor could have an in situ gas precursor synthesis region.

The gas heater could comprise a multi-zone heating system.

The substrate could comprise a member comprising a material chosen from the group consisting of sapphire, silicon carbide, silicon, GaAs, sapphire coated with GaN, GaN, AlN, ZnO, NdGaO$_3$, MgAl$_2$O$_4$, LiAlO$_2$ and LiGaO$_2$.

The growth reactor could be made of at least one of quartz, sapphire, boron nitride, aluminum nitride, silicon carbide, graphite coated with silicon carbide and stainless steel.

The substrate could be rotated in the growth reactor using gas purging or a motor.

Such a mixing plate could have holes of diameters less than $\frac{1}{20}$ of the effective diameter of the substrate.

Such a mixing plate could be made of at least one of quartz, sapphire, boron nitride, aluminium nitride, silicon carbide and graphite coated with silicon carbide.

Through the use of a specific vertical growth cell configuration and an extended diffusion gas flow, deposited layers with excellent compositional and thickness uniformity, and deposition efficiency can be produced in a system that is adaptable to many uses including the expeditious production of free standing thick III-nitride substrates. The advantages include: (1) absence of a laminar reactor zone, rendering the epitaxial growth insensitive to the main reactor configuration as well as to its atmosphere; (2) a shortened mixing zone with 2 to 4 times improved growth efficiency; (3) easy scalability to a high-throughput multi-wafer or larger diameter substrate; (4) recycling use of gases based on a close-cycle process to reduce the consumption of reagent gases. A time modulated growth and etch processes particularly suitable for this vertical growth cell can be employed to further minimise the defects density of the deposited materials.

The principal features of the vertical growth cell configuration are extended diffusion layer design of the reaction chamber, a homogenising gas flow diaphragm, side wall gas purging and independent hot wall gas heater and substrate heater. Exemplary of configurations to be described which satisfy these criteria include a reactor configuration with extended diffusion layer, an opposite direction flow geometry for input and output gases, a homogenising diaphragm, side wall gas purging and independent hot wall and substrate heaters (FIG. 4); a reactor configuration similar to FIG. 4, but with an internal gas precursor synthesis chamber (FIG. 5); a reactor configuration similar to FIG. 4, but without the counter flow (FIG. 6); a reactor with gas mixing means for homogenising input gases flow and with side wall inert gas purging to minimise parasitic growth (FIGS. 8 and 9); and a reactor similar to FIG. 4, but with a modified diaphragm (FIG. 7).

The essence of the designs is as follows. A substrate is out of a direct contact with gas flows and chemical exchange goes via diffusion processes inside the extended diffusion layer, having a nearly still gas layer, formed between a cylindrical exit slit and the bottom of the reaction chamber. The diaphragm with a critical inner diameter close to the dimension of the substrate allows the extended diffusion to enhance the efficiency of the reagent gas usage and obtain good growth uniformity, resulting from diffusion transport of the reagents to the substrate. The diaphragm also prevents the convection flow of hot gases to the gas outlets, and minimizes the parasitic growth on the gas outlets, side wall gas purging minimizing the parasitic growth along the side walls close to the substrate.

In addition, a bottom substrate heater allows control of the temperature difference between the substrate and the reactor walls, thus further suppressing parasitic deposition on the reactor walls. This heater will also control the cooling rate of the films deposited so that the stress and cracking of the reactor growth quartz tube and substrates could be minimised.

The cylindrical symmetry of this configuration provides an easy control and modeling of the growth processes, and easy scale-up into a multi-wafer production system.

In a preferred embodiment, it is possible to employ an extra mixing chamber with a perforated or quartz frit bottom plate and a hole diameter around $\frac{1}{50}$ of the substrate dimension to further enhance the gas mixing and deposition uniformity. The gas flow is adjusted so that the pressure produced by the gas in the chamber and the growth chamber is compatible. Additionally, it is possible to employ a secondary gas flow or a motor to induce rotation of the substrate during deposition and thus to further enhance the uniformity of the deposited layer. With this extra mixing chamber embodiment the dimension of the gas mixing region and extended region will maintain a similar dimension during a scale-up from a single wafer to multi-wafers system.

In another preferred embodiment, the system can be installed with the substrate clamped on the top of the reactor with the input reactive gases flowing upwards.

With an in situ interferometer or reflectivity monitor, the growth and etch back processes can be actively controlled. A time modulated growth and etch back technique can be employed to reduce the defect density of the deposited materials.

DETAILED DESCRIPTION

Figure 1:
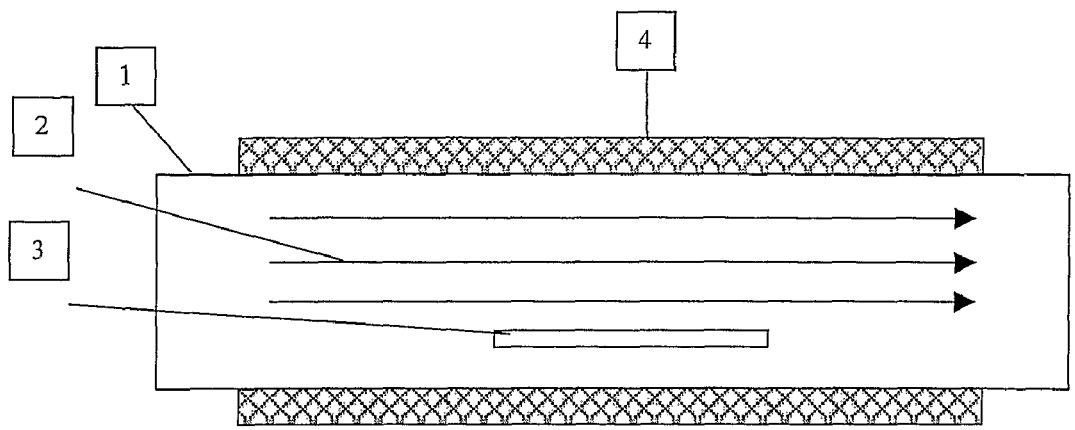
FIG. 1 is a schematic illustration of an HVPE reactor with a horizontal geometry of gas flow.
Figure 2:
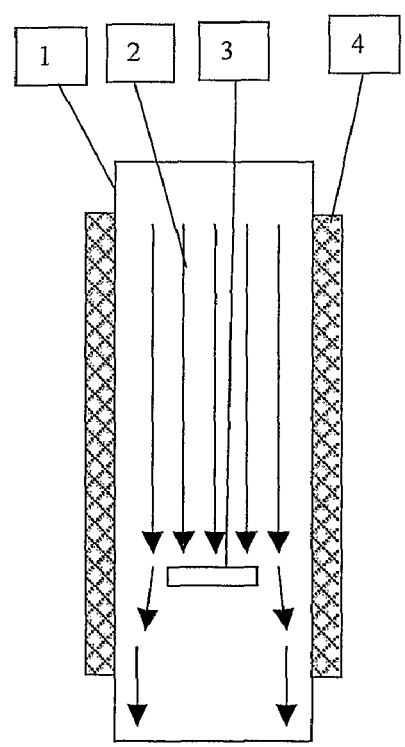
FIG. 2 is a schematic illustration of a prior art HVPE reactor with a vertical geometry of gas flow.

The growth processes provided by the invention can be applied to the family of III-V nitride compounds, generally of the formula $In_xG_yAl_{1-x-y}N$, where $0 \leq x \leq 1$, $0 \leq y \leq 1$, and $0 \leq x+y \leq 1$, or other suitable semiconducting nitrides. The following discussion will predominantly highlight GaN as an example of an epitaxial III-V nitride layer produced in accordance with the invention, but it is to be understood that the invention is not limited to production of a particular nitride.

Hydride-vapor phase epitaxy (HVPE), also called chloride transport chemical vapor deposition, of GaN is relatively well established process based on the gaseous transport of group III and group V elements to the deposition zone of a growth reactor. In fact Maruska and Tietjen (1969) grew the first high-quality GaN film on sapphire by this method. In this technique, Cl is used to transport the group-III species instead of organometallic sources in the MOCVD technique. This has a distinct advantage in that large growth rates (up to 100 μm/hr) can be achieved by this technique over the MOCVD or the MBE methods ($\leq 2$ μm/hr). In contrast to MOCVD, which is a non-equilibrium cold-wall reactor-based technique, HVPE is a reversible equilibrium-based process in which a hot-wall reactor is employed. The typical growth procedure is as follows. Sapphire, silicon carbide, zinc oxides or other compatible substrates are inserted into the deposition zone of the growth chamber and heated. When the final growth temperature is reached a $NH_3$ flow is started. After a period to allow the $NH_3$ concentration to reach a steady-state value, an HCl flow is started to provide transport of the gallium chloride (GaCl), which is synthesized by reacting HCl gas with liquid Ga metal in the Ga zone at 800-900° C. via the reaction: $2HCl(g)+2Ga(l) \rightarrow 2GaCl(g)+H_2(g)$. An alternative method of synthesis is by reacting chlorine gas with Ga metal around 125° C. Then, gaseous GaCl is transported from the Ga zone to the deposition zone to react with $NH_3$ at 900-1200° C. to form GaN via the reaction $GaCl(g)+NH_3(g) \rightarrow GaN(s)+HCl(g)+H_2(g)$. The thickness of deposited GaN layer by this way GaN can be up to 800 μm. Another advantage of the HVPE growth method is the mutual annihilation of mixed dislocations lowering the defect densities in thick GaN. These characteristics make HVPE an ideal technology for manufacturing free standing GaN and AlN substrates at low cost.

However, conventional HVPE systems have some inherent problems. These problems include: parasitic deposition of $NH_4Cl$ inside a conventional HVPE reactor; parasitic deposition of GaN on the gas outlets and sidewalls near the substrate; poor uniformity; and poor scalability to multi-wafer systems.

FIGS. 4 to 9 show schematically vertical HVPE reactors for carrying out examples of the invention for addressing these various issues in successfully carrying out an HVPE epitaxial layer growth process of a III-V nitride such as GaN with low defects density, minimum parasitic growth and enhanced deposition efficiency and uniformity.

Figure 4:
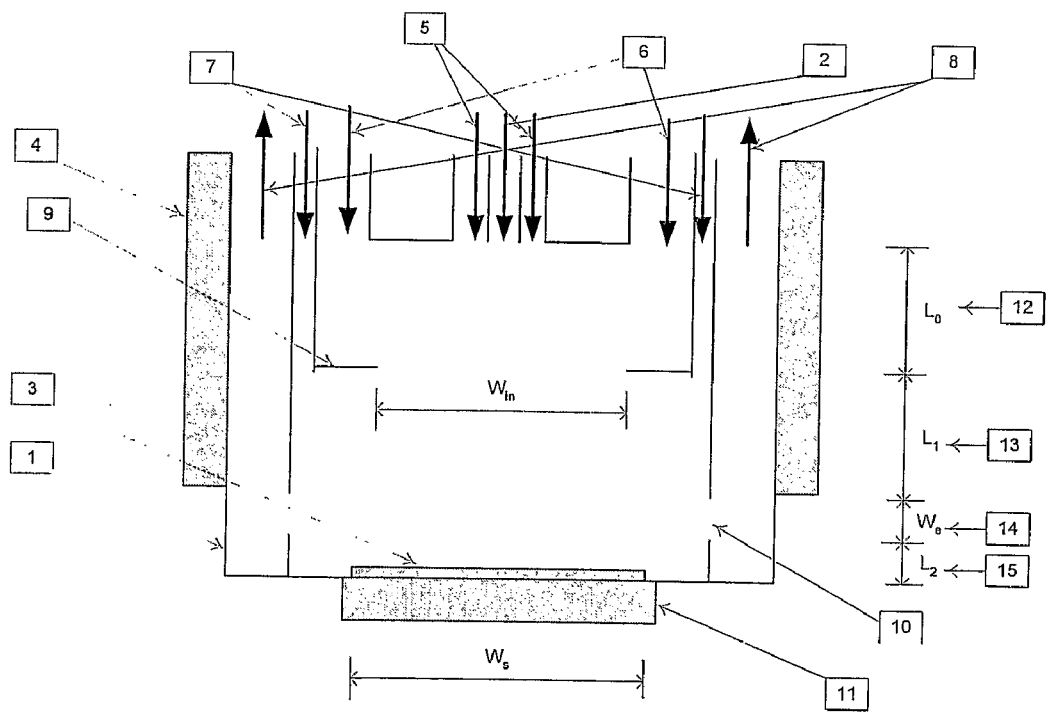
FIG. 4 is a schematic illustration of a vertical HVPE reactor for use in accordance with the invention.
Figure 5:
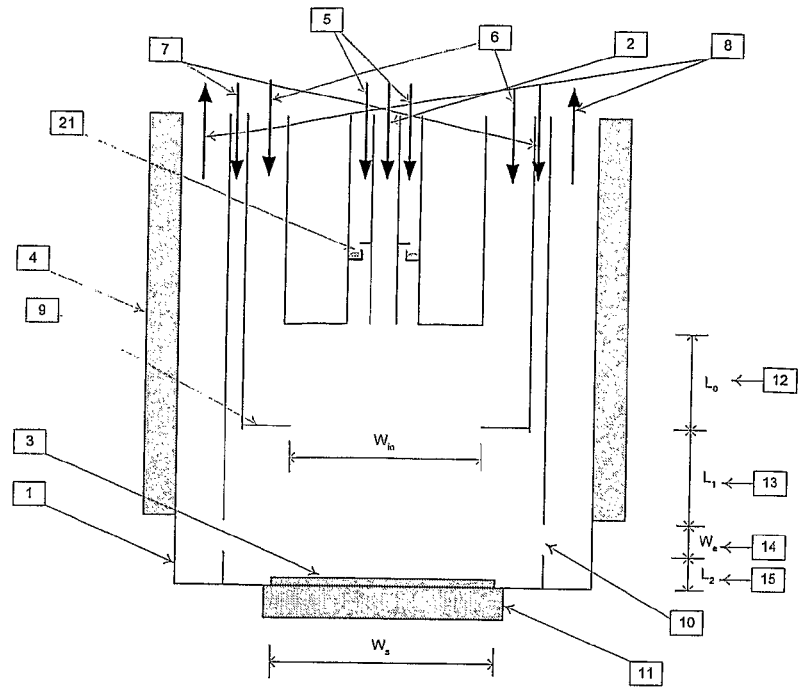
FIG. 5 is a schematic illustration of a vertical HVPE reactor similar to that of FIG. 4, but with an in situ gas precursor synthesis chamber.
Figure 6:
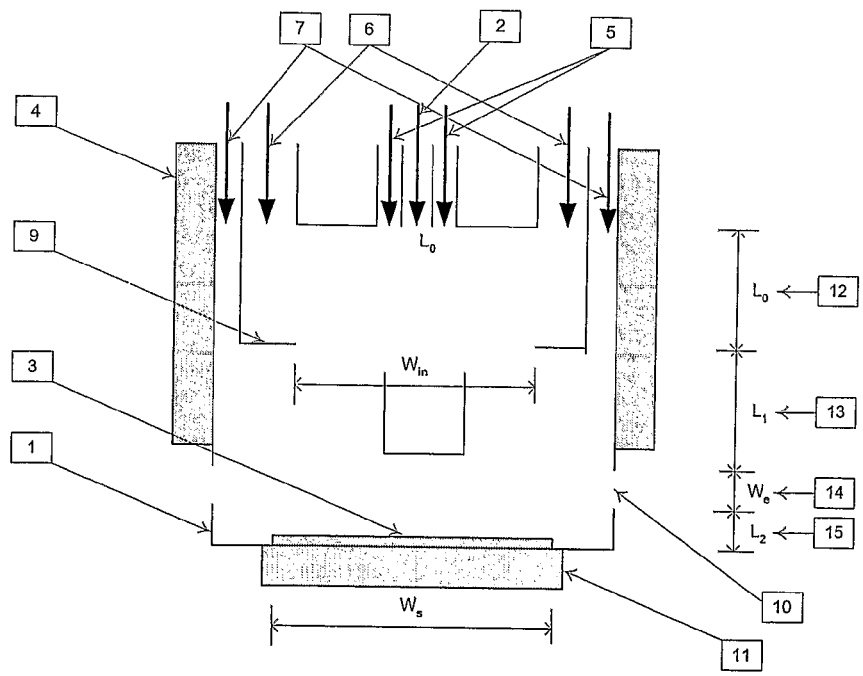
FIG. 6 is a schematic illustration of a vertical HVPE reactor similar to that of FIG. 4 except without gas counter flow.
Figure 7:
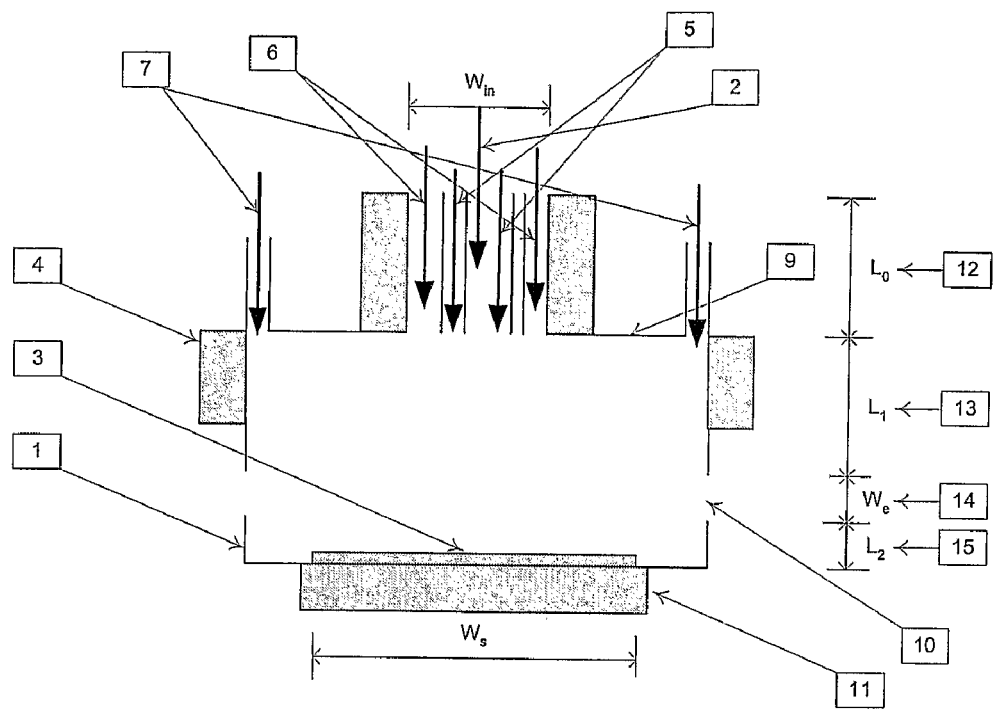
FIG. 7 is a schematic illustration of a vertical HVPE reactor similar to that of FIG. 4, but with a modified gas homogenising diaphragm configuration.

The principal scheme of a vertical HVPE reactor for carrying out an example of the invention with extended diffusion layer for growth of GaN films is shown in FIG. 4. It has a cylindrical growth chamber 1, with two sets of opposite flows of reagent gases (an input flow of a mixture of HCl, GaCl, $NH_3$ dopant gases and $H_2$ and $N_2$ gases (2, 5 and 6) and an output flow of HCl, GaCl, $NH_3$, $N_2$ and $H_2$ gases 8); a substrate 3; a side wall gas heater 4; a bottom substrate heater 11; a homogenizing diaphragm 9; a cylindrical side wall gas purging line 7; and a cylindrical side wall gas exit slit 10. FIG. 5 shows another vertical HVPE reactor similar to that of FIG. 4, but with an extra gas precursor synthesis region 21. FIG. 6 shows another embodiment of the reactor design similar to FIG. 4, but with a modified diaphragm 9.

The external gas heaters can be a single zone, two zone or three zone heating system. The reactor can have the extra precursor synthesis chamber for generating the gas precursors as in the configuration of FIG. 5.

The main growth chamber 1 can be made of quartz, sapphire, silicon carbide or silicon carbide coated materials. The tube assembly is configured in a resistively heated vertical furnace tube. The reactor shown in FIG. 5 provides three distinct regions, namely the precursor synthesis region 21, a gas mixing region 12 and 13 and a deposition region 15. With this configuration, the Ga precursor for the GaN growth reaction is synthesized in situ in the precursor synthesis region 21, upstream of the gas mixing chamber, into which the synthesized precursor is then diffused and homogenised through the extended diffusion distance and homogenising diaphragm 9. The resistive heating configuration, is a two zone heater, controlled such that the two chambers can be held at substantially different temperatures, thereby enabling simultaneous precursor synthesis and growth processes. The first zone heater temperature will be 800 to 900° C., and is located above the region 12. The second zone heater covers the region 12 and 13 with a temperature around 1000 to 1300° C. The independent substrate heater 11 allows the temperature of the substrate to be programmed in a controlled manner for optimized growth and cooling. The growth temperature for GaN is around 900 to 1100° C. The substrate heater 11 can be either a resistive or RF heater. Extra gas purging or a motor enables rotation of the substrate 3 during the growth process to enhance the uniformity.

One of the criteria to achieve much higher deposition efficiency and uniformity is that the substrate 3 is kept a distance away from direct contact with gas flows 2, 5, and 6, and chemical exchange happens via diffusion processes inside the extended diffusion region 13 and 15, region 15 being nearly a still gas layer formed between the cylindrical exit slit and the bottom of the reaction chamber.

Figure 10:
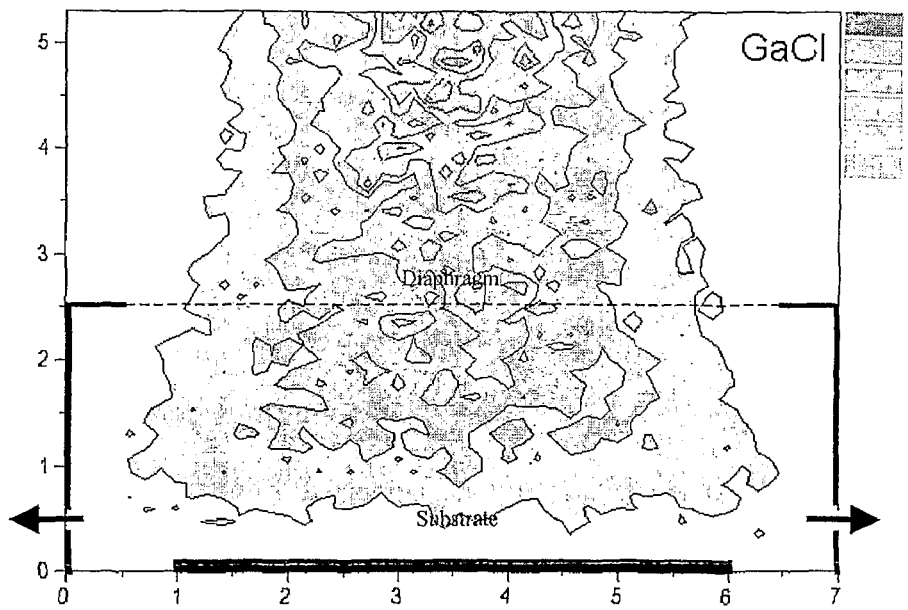
FIG. 10 shows the dependence of GaCl gas distribution on the distance from the gas outlet for a single 2 inch wafer system.
Figure 11:
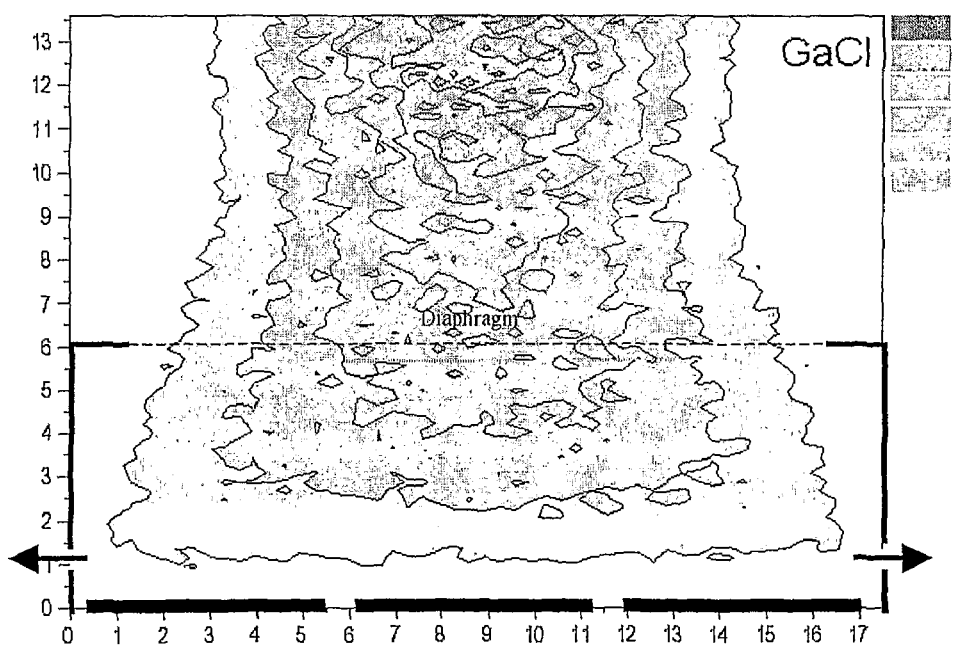
FIG. 11 shows the dependence of GaCl gas distribution on the distance from the gas outlet for a seven 2 inch wafer system.

The distribution of GaCl is the key factor for achieving highly uniform deposition because it has small diffusion coefficient. With a gas heater temperature around 860° C. and a substrate temperature of 1000° C., a pressure of the chamber of 1 atm, a total hot gas flow of 4 standard liters per minute and a V/III ratio of 10, it can be seen from FIG. 10 that the extended diffusion layer reaction chamber allows a good uniformity of GaCl concentration to be obtained near the substrate for a single wafer system. It can be seen from FIG. 11 that the dimension of the gas mixing region 12 and the extended diffusion region 13 and 15 needs to increase to be compatible with the total dimension of the mounted substrates to obtain good uniformity of GaCl concentration near the substrate for a seven wafer system.

Figure 12:
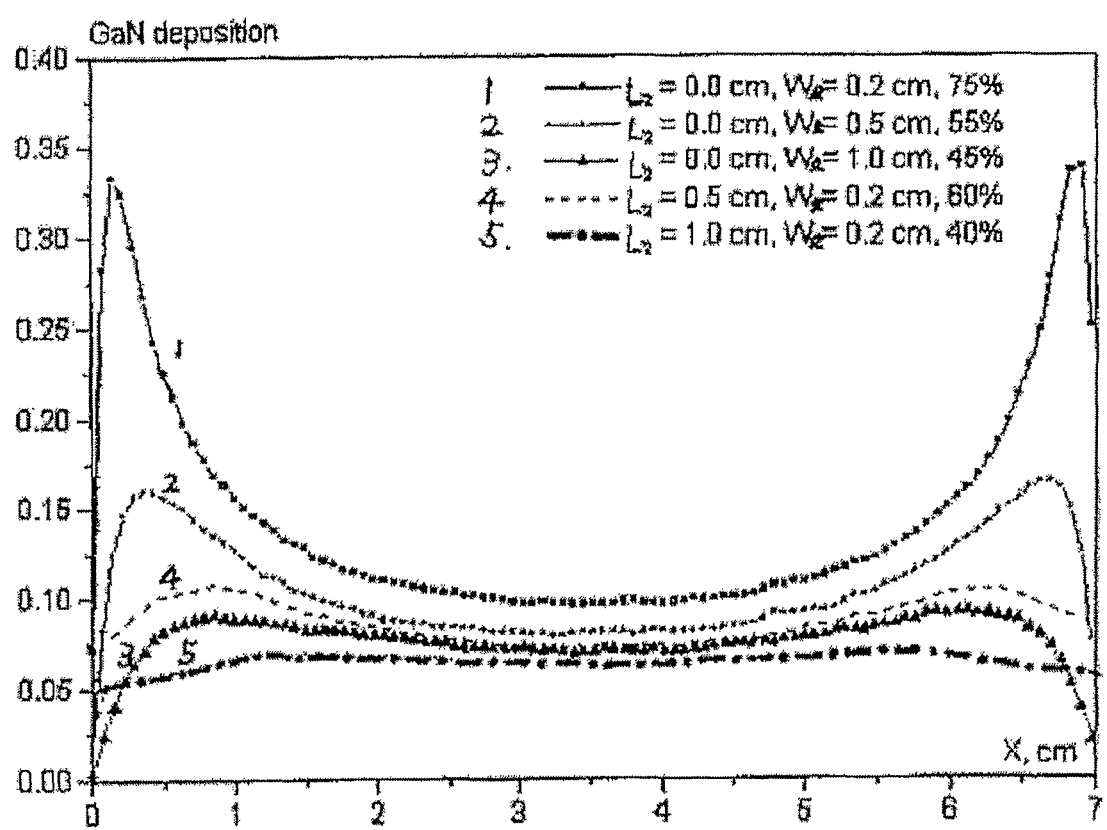
FIG. 12 shows the effect of the height of the gas exit relative to the substrate and the dimension of the exit hole $W_e$ on the uniformity and deposition efficiency of deposited GaN.
Figure 13:
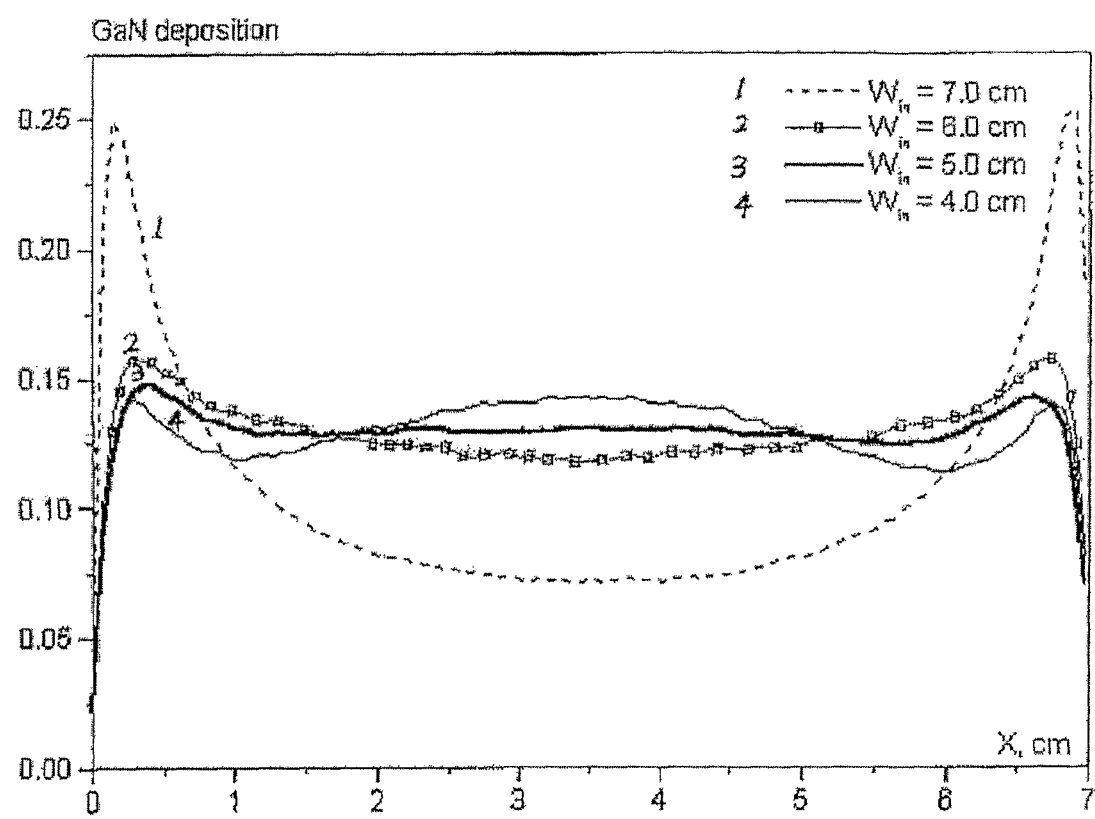
FIG. 13 shows the effect of the width of the diaphragm $W_{in}$ on the uniformity of deposited GaN.

The cylindrical vertical HVPE reactor design can be readily adjusted to achieve high deposition efficiency and uniformity. By changing the width ($W_e$) of the exit slit 10 at region 14, the diffusion layer thickness ($L_1$, $L_2$) of regions 13 and 15, diaphragm size ($W_{in}$) and position of the diaphragm 9, a trade-off between efficiency of gas utilization and growth uniformity can be achieved. FIG. 12 illustrates the impact of the diffusion layer thickness and the diameter of the gas exit slit on deposition uniformity and efficiency. With $L_2$=0.5 cm and $W_e$=0.2 cm, a deposition uniformity better than 2% from edge to edge across a 2 inch wafer and deposition efficiency around 60% can be achieved. FIG. 13 shows the dependence of the deposition uniformity of GaN on the diameter of the homogenizing diaphragm. With $L_2$=0.5 cm, $W_e$=0.2 cm and $W_{in}$=5 cm a deposition uniformity better than 2% from edge to edge can be achieved.

The substrate heater 11 allows controlling of the temperature difference between the substrate and the reactor walls and thus suppressing of the parasitic deposition of GaN on the reactor walls, and also allows the controlled cooling after growth to reduce the stress of the deposited films and the reactor tube. Side-wall gas purging line 7 further reduces the parasitic deposition of GaN and $NH_4Cl$ on the side-walls and exit slit.

Figure 3:
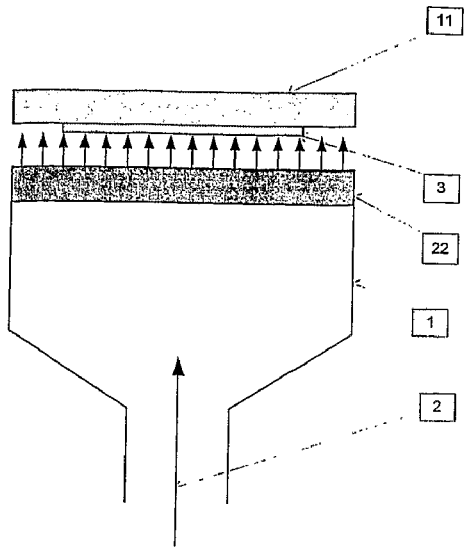
FIG. 3 is a schematic illustration of a CVD reactor with a close shower head.
Figure 8:
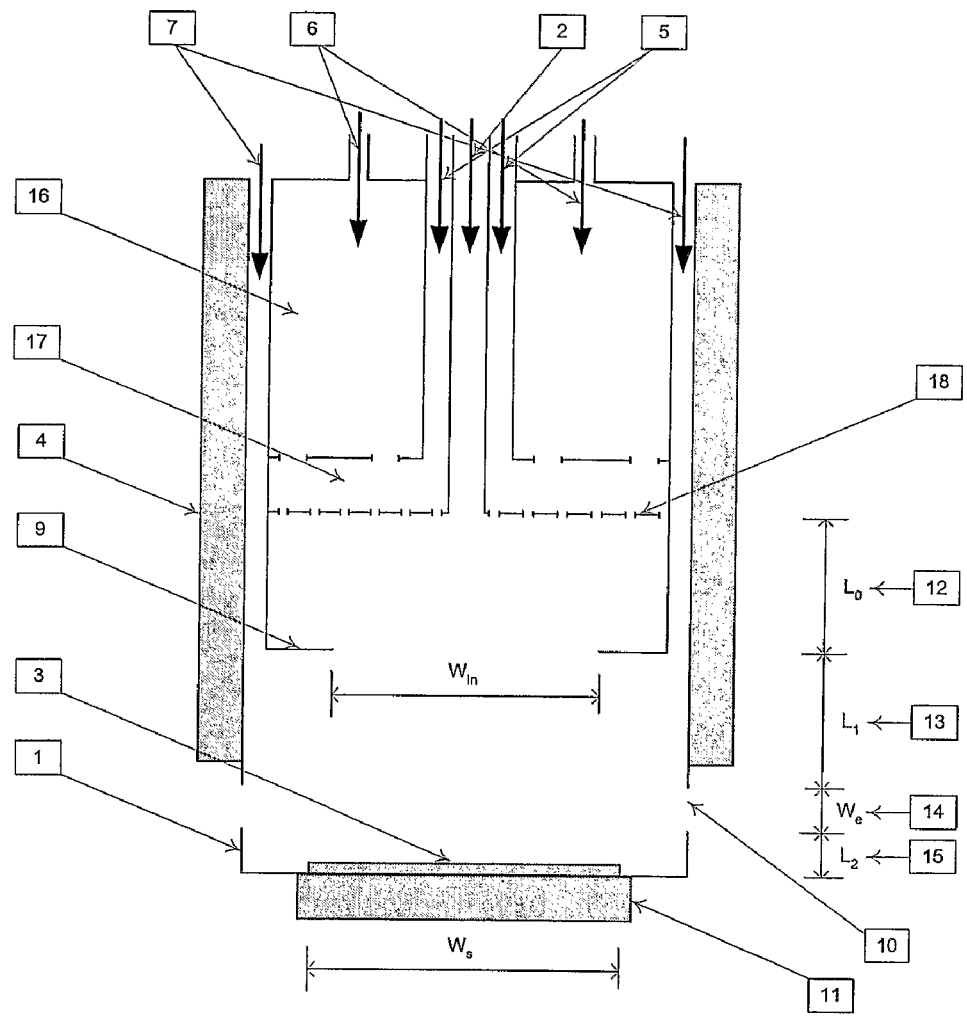
FIG. 8 is a schematic illustration of a vertical HVPE reactor with a perforated or quartz frit mixing plate.
Figure 14:
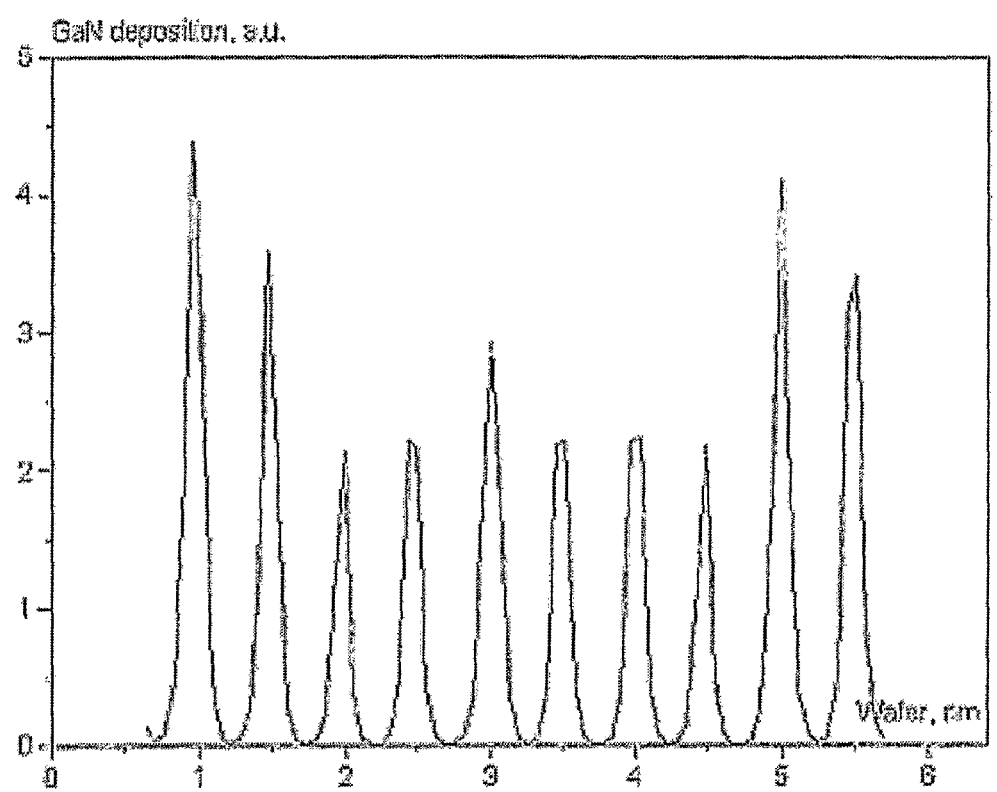
FIG. 14 shows the effect of the hole dimension on the uniformity of deposited GaN.
Figure 15:
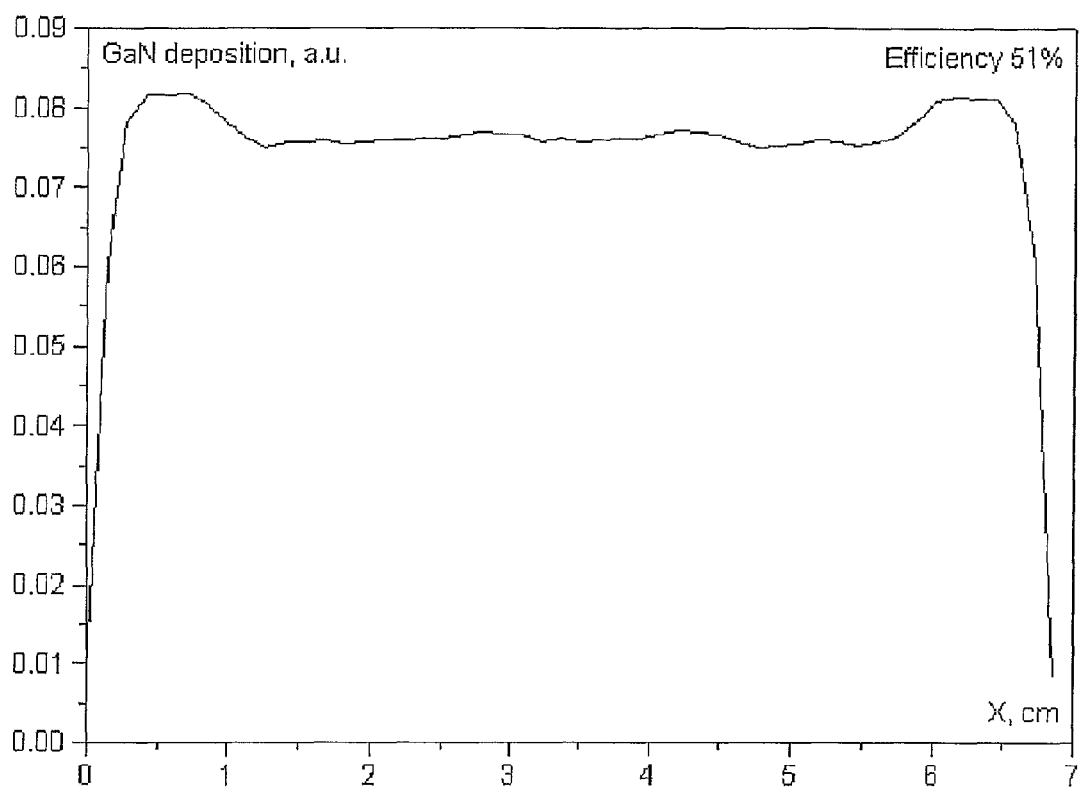
FIG. 15 shows uniformity better than 1% of deposited. GaN across a 2 inch wafer with an efficiency better than 50%.

The principle scheme of another vertical HVPE reactor for carrying out an example of the invention is shown in FIG. 8. A perforated or quartz frit mixing plate 18 is included to further improve the deposition uniformity. Its main parts are vertical cylindrical reactor chamber 1, with vertical flows of reagent gases (input flow 2, 5 and 6), substrate 3, side wall gas heater 4, bottom substrate heater 11, extended diffusion layer 13 and 15 ($L_1$ and $L_2$), perforated or quartz frit gas mixing plate 18, input flow homogenizing diaphragm 9, cylindrical side wall gas purging line 7, and sidewall gas exit slit 10. FIG. 14 shows the surface profile of deposited GaN on a 2 inch substrate based on the prior art close shower head design illustrated in FIG. 3 with the gas outlet and substrate distance less than ¼ of the substrate effective radius and perforated holes around 0.2 cm. A very non-uniform film thickness variation can be clearly observed. However, using a reactor according to FIG. 8, a deposition uniformity better than 2% for the deposited GaN film across a 2 inch wafer and growth efficiency better than 50% can be achieved (FIG. 15).

Figure 9:
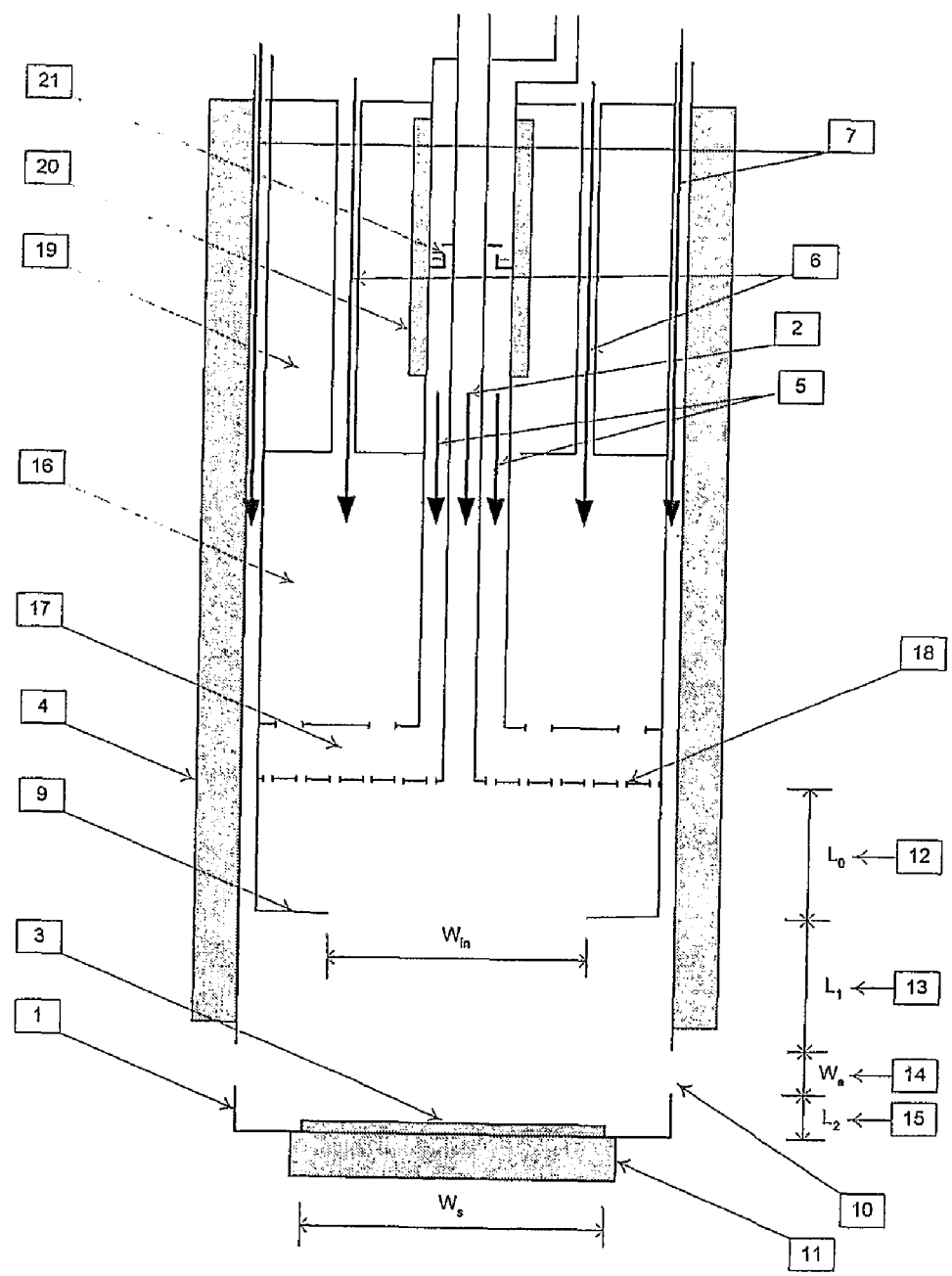
FIG. 9 is a schematic illustration of a vertical HVPE reactor similar to that of FIG. 8, but with an in situ gas precursor synthesis chamber.

The reactor of FIG. 9 has main features similar to that of FIG. 8, but with an upstream gas precursor synthesis region 21.

The main cylindrical tube in FIGS. 8 and 9 can be made of stainless steel with the gas delivery tubes for the HCl and GaCl transport made of quartz, sapphire or silicon carbide. Diluted GaCl with $N_2$ and/or $H_2$ will be injected through gas inlet 6. Additional HCl diluted with $N_2$ and/or $H_2$ will be injected through the gas inlet 2, which will also be used to install an in situ growth monitor (an interferometer or reflectivity spectrophotometer). This additional HCl will provide further means to reduce the parasitic deposition on the gas outlets of the plate 18, to enhance the deposition rate by the Cl induced surface diffusion mechanism, and to provide means to selectively etch back the deposited GaN films during the time modulated growth processes. Gas inlet 2 can also be used to inject dopant gases such as silane and Mg vapour for n- and p-type doping respectively. Diluted $NH_3$ will be injected through the gas inlet 6 into a pressure balance chamber 16. The less corrosive nature of $NH_3$ will allow the use of a stainless steel vessel to transport this gas. $NH_3$ and GaCl will be mixed within the mixing chamber 17. The external vertical tube gas heater will maintain the temperature to be around 350 to 500° C. with the external gas precursor (FIG. 8), the external vertical tube gas heater will maintain the temperature to be around 800 to 900° C. with the in situ gas precursor synthesis chamber (FIG. 9). The external vertical tube gas heater can also be configured to have two heating zones, the first gas heating zone being located just above the region 12 with a temperature around 800 to 900° C. and the second heating zone covering the region 12 and 13 with a temperature 50 to 1.00° C. higher than the growth temperature to prevent the parasitic GaN deposition on the side walls by introducing extra $H_2$ gas in upstream. The plate 18 is a removable unit and can be made of quartz, sapphire, boron nitride, or silicon carbide with a hole diameter less than the 1/20 of the diameter of the substrate. A cylindrical removable liner insert made of silicon carbide or boron nitride is used to protect the inner surface of the stainless steel chamber 1 in the region 12, 13, 14 and 15, side wall purging gas adding further protection to the chamber. The diaphragm 9 is also a removable and easily adjustable component, which can be made of quartz, sapphire, silicon carbide, aluminium nitride or boron nitride. The position and diameter of the diaphragm, the position of the substrate, the position and diameter of the gas exit slit are all adjustable to optimise the growth efficiency and uniformity according to the flow rate, pressure, temperature and type of gases. The substrate temperature during the growth is maintained around 900 to 1200° C. Another advantage for the embodiments illustrated in FIGS. 8 and 9 is the faster switching time for the changes of reactive gases achieved through the mixing plate 18 and the secondary gas mixing zone 12. The mixing plate design also allows the dimension of the secondary gas mixing zone 12 to stay the same during scale-up from a single wafer to a multi-wafer system. Without this mixing plate 18, an extra length is required to allow the gas diffusion to cover a larger effective substrate area during system scale-up.

The growth temperature in the HVPE method is rather high (~1000° C.) and, hence, one major problem of growing thick GaN film is cracks and lattice defects due to the use of a foreign substrate, for example sapphire (and, hence, a mismatch in the lattice constants and thermal expansion coefficient between the GaN layer and the substrate). The approach currently employed to solve this problem is so-called lateral epitaxy over growth (ELOG). However, this approach is expensive because it requires a MOCVD GaN template, and three additional expensive pre-growth steps ($SiO_2$ deposition, photolithography and etching). The growth process employed in the examples of this invention is called the time-modulated growth method (TIMG). The method is based on a unique feature of the cylindrical vertical HVPE configuration illustrated in FIGS. 4 to 9, which allows the quick switching between different reactive gases for a controlled growth mode (lateral or vertical) and in situ etching of GaN. In this method, the flow of reagent gases is on ($NH_3$ and GaCl on) and off (GaCl off, HCl on) in turn for the growth mode or the etching mode respectively. A great deal of defects can be suppressed during this procedure within the initial growth layers, Etching and annealing during the break of growth lead to the reconstruction of the GaN surface as well as to the relaxation of strain and stress in the GaN film due to a difference of the normal and lateral etching rates. The TIMG can be performed during the entire GaN growth run inside a vertical HVPE reactor and does not require expensive technological steps. Also, the use of thinned and mechanically weakened sapphire substrates leads to cracks in substrates instead of the deposited GaN epilayer.

The invention will be more fully understood by reference to the following examples:

EXAMPLE 1

A c-plane-oriented sapphire substrate of About 2 inches in diameter is loaded on to the substrate holder of a HVPE vertical reactor according to FIG. 4, 6, 7 or 8. The sapphire is deposited with MOCVD grown GaN of 2 μm thickness, and the sapphire is mechanically thinned and weakened.

The gas heater is heated to a temperature of about 500° C. $N_2$ is introduced through all gas injectors 2, 5, 6 and 7 for about 30 minutes to purge the tube assembly of air. The pressure of the growth chamber is maintained at 1 atm. Substrates are heated to a temperature of about 350° C. $NH_3$ flow at about 1000 sccm is introduced into the chamber. The external GaCl gas precursor is produced by passing 10% $Cl_2$ in $N_2$ through a Ga bubbler, the gas transport line being made of nylon with a heating wire to maintain the nylon tube temperature around 125° C. The conversion rate is nearly 100% for GaCl. Then the substrates are heated to a temperature of about 1050° C.

Gas delivery to the growth chamber is set as follows: $NH_3$ flow at about 1000 sccm; GaCl flow at about 80 sccm; and $N_2$ and $H_2$ to make the rest of the gas. A $N_2$ flow of about 2400 sccm and a $H_2$ flow of about 60 sccm is divided among the gas inlets 2, 5, 6, and 7. A steady total gas flow is maintained through the whole growth processes.

The nitride HVPE growth process is carried out by a time-modulated growth method. In this method the flow of reagent gases is on ($NH_3$ and GaCl on) and off (GaCl off, HCl oil) in turn for the growth mode or the etching mode respectively. The times for the on and off period are set to be around 3 minutes and 1 minute respectively. The HCl flow during the etching is set at 80 sccm. The GaN growth step is continued until a GaN epitaxial layer of sufficient thickness is produced. For a growth with the V/III ratio set between 10 and 40 in the vertical reactor of FIG. 4, 6, 7 or 8, a growth rate of between about 20 μLm/hour and about 160 μm/hour can be achieved. Uniformity of the growth is without aided rotation is better than 2% from edge to edge in a 2 inch wafer.

In the nitride growth termination, GaCl gas is switched off, flow of $NH_3$ being maintained at the same level and $N_2$ flow being increased to make up the steady total gas flow. The substrate cool-down is controlled in process steps of less than 20° C./min between 1050 and 900° C. and less than 100° C. between 900° C. and 500° C. The flow of $NH_3$ is then switched off below a temperature of 500° C. The cool-down continues with a rate less than 100° C./min between 500° C. and room temperature. During this time, the gas heater maintains a temperature of about 350° C., the substrates are lowered down from the chamber, slowing to maintain the cool-down rate of less than 100° C./in.

Once the substrates are cooled and removed from the reactor, the sapphire substrate can be removed from the GaN epitaxial layer by, e.g. etching in phosphoric acid or other suitable etchant, by electrochemical mechanical polishing, laser ablation using UV lasers or other suitable process.

EXAMPLE 2

The growth processes are similar to Example 1 in the case of a vertical HVPE reactor shown in FIG. 5 or 9, except the gas precursor of GaCl is produced in situ up-stream in the growth chamber. It is recommended that $NH_3$ is switched on when the gases and substrates are heated above 500° C.

EXAMPLE 3

The growth processes are similar to Example 1, but the time-modulated growth method is modified. The growth is divided into etch, annealing, enhanced lateral growth and normal growth. In this example, the flow of reagent gases is etch (GaCl off, $NH_3$ and HCl on with a gas flow of 80 sccm), annealing (GaCl off, $NH_3$ and HCl on with a gas flow of 5 sccm), enhanced lateral growth (GaCl and $NH_3$ on, HCl on with a gas flow of 5 sccm, total. $H_2$ flow increasing from 60 to 200 scorn) and normal growth (GaCl and $NH_3$ on, HCl on with gas flow of 5 sccm, total $H_2$ flow of 60 sccm). The time for the etch, annealing, enhanced lateral growth and normal growth period is set to be 1, 1, 3 and 2 minutes respectively.

EXAMPLE 4

The growth processes are similar to Example 1, n-type GaN being deposited with silane (2% in $H_2$) injected through gas inlet 2 at a flow of 2 to 20 sccm.

EXAMPLE 5

The growth processes are similar to Example 1, p-type GaN being deposited with $Cp_2Mg$ or Magnesium vapor injected through gas inlet 2 at a flow of 7 to 50 sccm ($Cp_2Mg$ bubbler pressure 1000 mBar, bubbler temperature 25° C., carrier gas $H_2$).

As can be recognized from the discussion above and from the recited experimental examples, a wide range of process parameters can be accommodated by the above cylindrical vertical HVPE reactors. Accordingly, it is to be understood that the protection sought to be afforded hereby should be deemed to extend to the subject matter of the claims and all equivalents thereof fairly within the scope of the invention.

The invention claimed is:

1. A chemical vapour deposition process for forming a material layer on a surface of a substrate, comprising the use of a cylindrical vertical hydride vapour phase epitaxy (HVPE) growth reactor with an extended diffusion layer, a homogenizing diaphragm, independent side wall gas heater and substrate heater, a reagent gas input, a reagent gas output, a cylindrical side wall gas purging line and a cylindrical side wall gas exit slit, the cylindrical side wall gas purging line being used to purge the reactor during deposition.

2. A process according to claim 1, where the material layer comprises group III-V and VI materials.

3. A process according to claim 1, wherein the material layer deposited on the surface of the substrate is provided by a time-modulated growth method, allowing switching between different reactive gases for a controlled growth mode (lateral or vertical) and in situ etching and annealing of deposited material.

4. A process according to claim 1, wherein the growth reactor uses an opposite direction flow geometry.

5. A process according to claim 1, wherein the diaphragm has a diameter which is close to the effective diameter of the substrate.

6. A process according to claim 1, wherein the growth reactor has a mixing chamber and a mixing plate to enhance deposition uniformity.

7. A process according to claim 1, wherein the extended diffusion layer has a length larger than the effective diameter of the substrate.

8. A process according to claim 1, where the growth reactor has an in situ gas precursor synthesis region.

9. A process according to claim 1, wherein the gas heater comprises a multi-zone heating system.

10. A process according to claim 1, wherein said substrate comprises a member comprising a material chosen from the group consisting of sapphire, silicon carbide, silicon, GaAs, sapphire coated with GaN, MN, ZnO, $NdGaO_3$, $MgAl_2O_4$, $LiAlO_2$ and $LiGaO_2$.

11. A process according to claim 1, wherein the growth reactor is made of at least one of quartz, sapphire, boron nitride, aluminium nitride, silicon carbide, graphite coated with silicon carbide and stainless steel.

12. A process according to claim 1, wherein the substrate in the growth reactor is rotated using gas purging or a motor.

13. A process according to claim 6, wherein the mixing plate has holes of diameters less than ¹⁄₂₀ of the effective diameter of the substrate.

14. A process according to claim 6, wherein the mixing plate is made of at least one of quartz, sapphire, boron nitride, aluminium nitride, silicon carbide and graphite coated with silicon carbide.

15. A process according to claim 6 wherein the mixing plate comprises a perforated or quartz frit mixing plate.

16. A chemical vapour deposition apparatus for forming a material layer on a surface of a substrate, comprising a cylindrical vertical hydride vapour phase epitaxy (HVPE) growth reactor with an extended diffusion layer, a homogenizing diaphragm, independent side wall gas heater and substrate heater, a reagent gas input, a reagent gas output, a cylindrical side wall gas purging line for purging the reactor during deposition and a cylindrical side wall gas exit slit.

17. Apparatus according to claim 16, wherein the growth reactor uses an opposite direction flow geometry.

18. Apparatus according to claim 16, wherein the diaphragm has a diameter which is close to the effective diameter of the substrate.

19. Apparatus according to claim 16, wherein the growth reactor has a mixing chamber and a mixing plate to enhance deposition uniformity.

20. Apparatus according to claim 16, wherein the extended diffusion layer has a length larger than the effective diameter of the substrate.

21. Apparatus according to claim 16, where the growth reactor has an in situ gas precursor synthesis region.

22. Apparatus according to claim 16, wherein the gas heater comprises a multi-zone heating system.

23. Apparatus according to claim 16, wherein the growth reactor is made of at least one of quartz, sapphire, boron nitride, aluminium nitride, silicon carbide, graphite coated with silicon carbide and stainless steel.

24. Apparatus according to claim 16, including means for using gas purging or a motor to rotate the substrate in the growth reactor.

25. Apparatus according to claim 19, wherein the mixing plate is made of at least one of quartz, sapphire, boron nitride, aluminium nitride, silicon carbide and graphite coated with silicon carbide.

26. A chemical vapour deposition process for forming a material layer on a surface of a substrate, comprising the use of a cylindrical vertical hydride vapour phase epitaxy (HVPE) growth reactor with an extended diffusion layer, a homogenizing diaphragm,
   independent side wall gas heater and substrate heater, a cylindrical side wall gas purging line and a cylindrical side wall gas exit slit, wherein the growth reactor has a mixing chamber and
   a mixing plate to enhance deposition uniformity and the mixing plate comprises a perforated or quartz frit mixing plate.

27. A process according to claim 26, where the material layer comprises group III-V and VI materials.

28. A process according to claim 26, wherein the material layer deposited on the surface of the substrate is provided by a time-modulated growth method, allowing switching between different reactive gases for a controlled growth mode (lateral or vertical) and in situ etching and annealing of deposited material.

29. A process according to claim 26, wherein the growth reactor uses an opposite direction flow geometry.

30. A process according to claim 26, wherein the diaphragm has a diameter which is close to the effective diameter of the substrate.

31. A process according to claim 26, wherein the extended diffusion layer has a length larger than the effective diameter of the substrate.

32. A process according to claim 26, where the growth reactor has an in situ gas precursor synthesis region.

33. A process according to claim 26, wherein the gas heater comprises a multi-zone heating system.

34. A process according to claim 26, wherein said substrate comprises a member comprising a material chosen from the group consisting of sapphire, silicon carbide, silicon, GaAs, sapphire coated with GaN, AlN, ZnO, $NdGaO_3$, $MgAl_2O_4$, $LiAlO_2$ and $LiGaO_2$.

35. A process according to claim 26, wherein the growth reactor is made of at least one of quartz, sapphire, boron nitride, aluminium nitride, silicon carbide, graphite coated with silicon carbide and stainless steel.

36. A process according to claim 26, wherein the substrate in the growth reactor is rotated using gas purging or a motor.

37. A process according to claim 26, wherein the mixing plate has holes of diameters less than $1/20$ of the effective diameter of the substrate.

38. A chemical vapour deposition apparatus for forming a material layer on a surface of a substrate, comprising a cylindrical vertical hydride vapour phase epitaxy (HVPE) growth reactor with an extended diffusion layer, a homogenizing diaphragm, independent side wall gas heater and substrate heater, a cylindrical side wall gas purging line and a cylindrical side wall gas exit slit, wherein the growth reactor has a mixing chamber and a mixing plate to enhance deposition uniformity and the mixing plate comprises a perforated or quartz fit mixing plate.

39. Apparatus according to claim 38, wherein the growth reactor uses an opposite direction flow geometry.

40. Apparatus according to claim 38, wherein the diaphragm has a diameter which is close to the effective diameter of the substrate.

41. Apparatus according to claim 38, wherein the extended diffusion layer has a length larger than the effective diameter of the substrate.

42. Apparatus according to claim 38, where the growth reactor has an in situ gas precursor synthesis region.

43. Apparatus according to claim 38, wherein the gas heater comprises a multi-zone heating system.

44. Apparatus according to claim 38, wherein the growth reactor is made of at least one of quartz, sapphire, boron nitride, aluminium nitride, silicon carbide, graphite coated with silicon carbide and stainless steel.

45. Apparatus according to claim 38, including means for using gas purging or a motor to rotate the substrate in the growth reactor.

46. Apparatus according to claim 38, wherein the mixing plate is made of at least one of quartz, sapphire, boron nitride, aluminium nitride, silicon carbide and graphite coated with silicon carbide.

* * * * *

UNITED STATES PATENT AND TRADEMARK OFFICE
CERTIFICATE OF CORRECTION

| | |
|---|---|
| PATENT NO. | : 7,906,411 B2 |
| APPLICATION NO. | : 11/571514 |
| DATED | : March 15, 2011 |
| INVENTOR(S) | : Wang Nang Wang et al. |

Page 1 of 1

It is certified that error appears in the above-identified patent and that said Letters Patent is hereby corrected as shown below:

In the Claims

| | |
|---|---|
| Column 10, Claim 10, line 47 | Delete "MN" |
| | Insert -- A1N -- |
| Column 12, Claim 38, line 31 | Delete "fit" |
| | Insert -- frit -- |

Signed and Sealed this
Twelfth Day of June, 2012

David J. Kappos
*Director of the United States Patent and Trademark Office*